United States Patent [19]
Tihanyi

[11] Patent Number: 6,061,221
[45] Date of Patent: May 9, 2000

[54] TEMPERATURE-PROTECTED ELECTRICAL SWITCH COMPONENT

[75] Inventor: Jenoe Tihanyi, Kirchheim, Germany

[73] Assignee: Siemens Aktiengesellschaft, Munich, Germany

[21] Appl. No.: 09/272,671

[22] Filed: Mar. 18, 1999

Related U.S. Application Data

[63] Continuation of application No. PCT/DE97/01575, Jul. 25, 1997.

[30] Foreign Application Priority Data

Sep. 18, 1996 [DE] Germany .......................... 196 38 089

[51] Int. Cl.$^7$ .................................................. H02H 5/04
[52] U.S. Cl. .......................... 361/103; 307/117; 327/513; 361/100
[58] Field of Search .............................. 361/28, 103, 106, 361/93.8, 98, 100–101; 307/116, 117; 323/907; 327/512–513, 378

[56] References Cited

U.S. PATENT DOCUMENTS

| | | |
|---|---|---|
| 4,345,218 | 8/1982 | Congdon et al. . |
| 5,001,593 | 3/1991 | Zitta et al. ............................ 361/103 |
| 5,070,322 | 12/1991 | Fujihira .................................. 340/653 |
| 5,267,118 | 11/1993 | Marshall et al. . |
| 5,563,760 | 10/1996 | Lowis et al. ............................ 361/103 |
| 5,886,515 | 3/1999 | Kelly ...................................... 323/313 |

FOREIGN PATENT DOCUMENTS

| | | |
|---|---|---|
| 0 617 497 A1 | 9/1994 | European Pat. Off. . |
| 43 05 038 A1 | 8/1994 | Germany . |
| 2 248 151 | 3/1992 | United Kingdom . |

OTHER PUBLICATIONS

"TEMPEFET" Step Towards The Ideal Power Semiconductor Switch (Brauschke et al.), Siemens Components, vol. 27, No. 6, 1989, pp. 228–232.

"Low–Side Switches Unlimited" (Reinmuth), Components XXXI, No. 3, 1996, pp. 18–20.

"Smart SIPMOS Components" (Rabl), 8229 Siemens Components, vol. 25, No. 6, Berlin 1990, pp. 233–239.

*Primary Examiner*—Fritz Fleming
*Assistant Examiner*—Kim Huynh
*Attorney, Agent, or Firm*—Herbert L. Lerner; Laurence A. Greenberg; Werner H. Stemer

[57] ABSTRACT

The electrical switch component has two temperature sensors. The first temperature sensor is provided at that location of the component which is warmest during operation. The first sensor switches the component off when a first, upper threshold value is reached, and switches the component on when the temperature falls below a second, lower threshold value. The oscillation owing to the first temperature sensor is switched on and off by the second temperature sensor, which is arranged remote from the first temperature sensor at a location that is less warm than the first temperature sensor. The second sensor has lower threshold values than the first temperature sensor.

12 Claims, 3 Drawing Sheets

U.S. Patent    May 9, 2000    Sheet 3 of 3    6,061,221
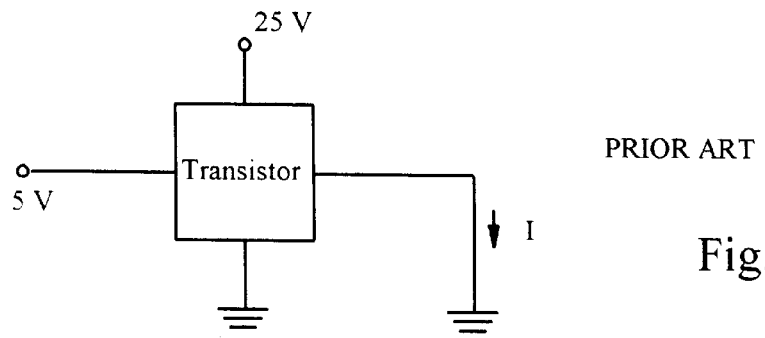
PRIOR ART
Fig. 5
Fig. 6
PRIOR ART
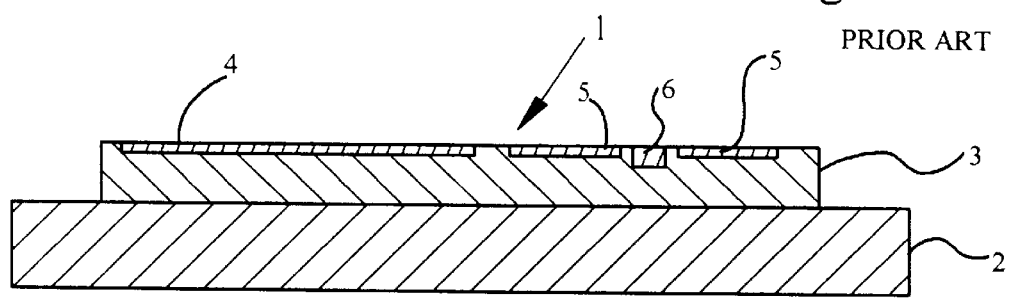
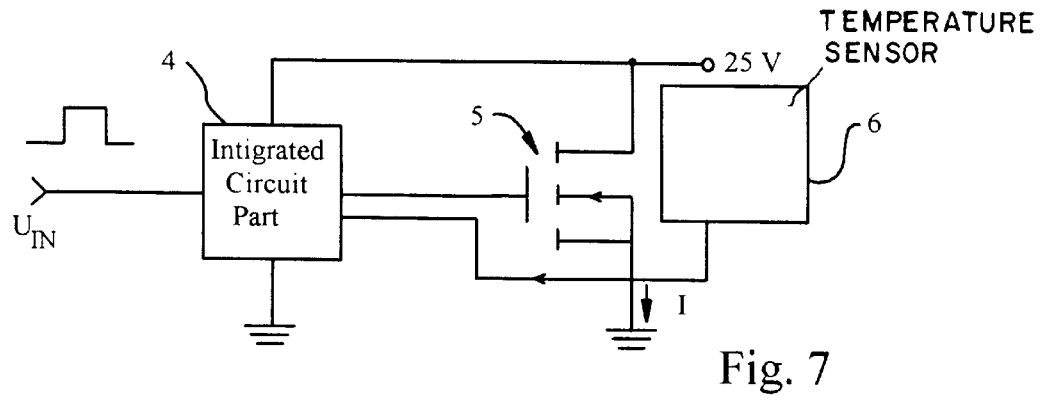
Fig. 7
PRIOR ART
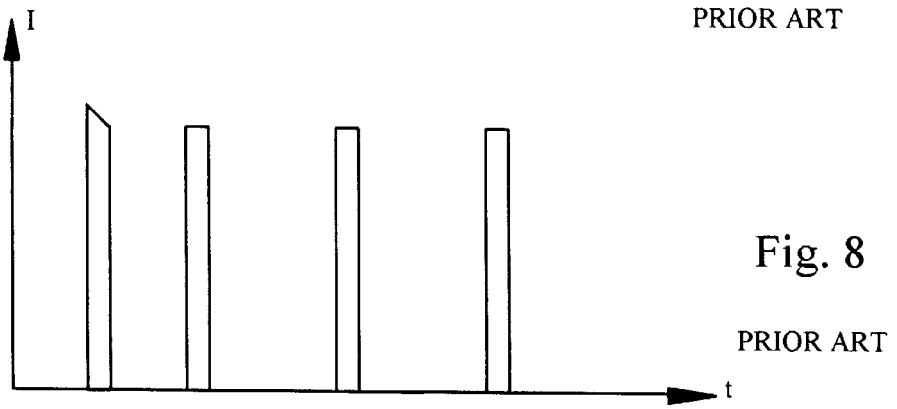
Fig. 8
PRIOR ART

TEMPERATURE-PROTECTED ELECTRICAL SWITCH COMPONENT

CROSS REFERENCE TO RELATED APPLICATION

This is a continuation of copending International Application PCT/DE97/01575, filed Jul. 25, 1997, which designated the United States.

BACKGROUND OF THE INVENTION

Field of the Invention

The invention relates to a temperature-protected electrical switch component, and in particular to a semiconductor switch. A first temperature sensor is provided at a first location. The first sensor causes the switch component to switch a load current off when the temperature detected by the sensor exceeds a first threshold value and to switch the load current on again when the temperature detected by the temperature sensor falls below a second threshold value, which is lower than the first threshold value. The load current thus forms an oscillation. A temperature-protected electrical switch component of this type is, for example, a temperature-protected field-effect transistor (PROFET, HITFET, TEMPFET).

Temperature-protected field-effect transistors, which are mainly used as semiconductor switches, are supposed to switch off a load current in the event of a short circuit as soon as the temperature at the field-effect transistor reaches a specific upper limit. Thus, printed circuit boards in certain housings can only withstand temperatures of up to about 150° C., because the soldered points of these printed circuit boards are destroyed at higher temperatures. In other words, when the temperature of 150° C. is exceeded, a temperature sensor and a logic circuit assigned to the sensor are supposed to ascertain a short-circuit situation and switch off the load current by means of the field-effect transistor that is operated as a semiconductor switch.

The diagram of FIG. 5 illustrates a prior art temperature-protected field-effect transistor 1 of this type. An operating voltage of 25 V and an input voltage of 5 V, for example, are applied to the temperature-protected field-effect transistor 1. When the temperature exceeds approximately 150° C., then a load current I is switched off.

In FIG. 6 the temperature-protected field-effect transistor of FIG. 5 is illustrated in a diagrammatic sectional view. A metal plate 2 carries a semiconductor body or chip 3 with an integrated circuit part (IC part) 4 and a field-effect transistor 5. A source and a drain of the transistor 5 are illustrated diagrammatically. A temperature sensor 6 is disposed in the region of the cell array of the field-effect transistor 5. The temperature sensor 6 may be a diode or a bipolar transistor.

Referring now to FIG. 7, there is shown the electrical circuit configuration of the temperature-protected field-effect transistor 1. The temperature sensor 6 lies in the region of the field-effect transistor 5, through which the load current I flows. The IC part 4 forms a logic circuit that can be used to set an upper temperature threshold and a lower temperature threshold. When the temperature measured by the temperature sensor 6 exceeds the upper threshold value, then the logic circuit switches the field-effect transistor 5 off. The load current I stops to flow. As a result, the region around the temperature sensor 6 begins to cool down. When the temperature measured by the temperature sensor 6 then reaches the lower threshold value, then the logic arrangement switches the field-effect transistor 5 back on. The load current I begins to flow again. Once the upper temperature threshold has been reached once more, as measured by the temperature sensor 6, the field-effect transistor 5 is switched off again until the lower temperature threshold is reached.

This results in a periodic switch-on/switch-off operation, as graphed in FIG. 8. The temperature of the semiconductor body 3 settles to a value between the two threshold values. The period time in this case depends on the cooling, in particular via the metal plate 2.

Temperature-protected semiconductor switches are particularly used together with lamps and motors as loads. It has been shown, however, that these loads do not switch back on after a short circuit because the surge current that occurs on reconnection is sensed as another short circuit.

SUMMARY OF THE INVENTION

It is accordingly an object of the invention to provide a temperature-protected electrical switch component, which overcomes the above-mentioned disadvantages of the heretofore-known devices and methods of this general type and which ensures a low temperature of the soldered points and reliable reconnection of a load after a short circuit.

With the foregoing and other objects in view there is provided, in accordance with the invention, a temperature-protected electrical switch component, comprising:

a switch component conducting a load current and having a first location and a second location spaced apart from the first location, the second location assuming a lower temperature than the first location during an operation of the switch component;

a first temperature sensor disposed at the first location, the first temperature sensor effecting an oscillation of the load current by causing the switch component to switch the load current off when a temperature detected by the first temperature sensor exceeds a first threshold value and to switch the load current on when the temperature detected by the first temperature sensor falls below a second threshold value, the second threshold value lying below the first threshold value;

a second temperature sensor disposed at the second location, the second temperature sensor having a third threshold value below the second threshold value and a fourth threshold value below the third threshold value, the second temperature sensor causing the switch component to switch off the oscillation of the load current when the temperature detected by the second temperature sensor exceeds the third threshold value and to switch the oscillation back on when the temperature detected by the second temperature sensor falls below the fourth threshold value.

Although the invention can be applied generally to electrical switch components in which a temperature increase above a critical limit is to be avoided, a preferred field of application of the invention is in semiconductor switches in the form of temperature-protected field-effect transistors.

In accordance with an added feature of the invention, the first location is defined at a location of the component which is warmest during operation. In the same vein, the second location is heated more slowly than the first location during the operation of the component.

What is essential to the invention is the fact that in addition to the temperature sensor, which is preferably provided at the "hottest" location of the temperature-protected electrical switch component, a further temperature sensor is also employed whose threshold values lie below those of the temperature sensor which is situated at a location of the temperature-protected electrical switch component that is heated only relatively little and which switches the oscillation of the load current on and off.

In accordance with an additional feature of the invention, a temperature interval between the first and second threshold values is smaller than a temperature interval between the third and fourth threshold values.

In accordance with a further feature of the invention, the second location is defined on the component or, alternatively, on a further component. In other words, the second temperature sensor may be accommodated on a further component or a further semiconductor body or IC chip, which also applies to chip-on-chip components.

The first temperature sensor is preferably arranged in the cell array of the switch component since that location is usually the location which is heated the quickest. This temperature sensor has relatively low hysteresis and—as already explained—higher threshold values than the further temperature sensor. In the event of a short circuit, the first temperature sensor is switched on and off periodically, the temperature of the semiconductor body rising if the switch component is a semiconductor switch. The further, second temperature sensor is more remote from the switch component and thus becomes hot only relatively slowly. Its threshold values are lower than those of the first temperature sensor, and its hysteresis is greater than that of the first temperature sensor.

If the temperature at the second temperature sensor reaches the upper or third threshold value thereof, the oscillation of the load current by the first temperature sensor is switched off. As a result, the temperature is distributed uniformly in the entire switch component, with the result that the latter gradually cools down. As soon as the temperature at the second temperature sensor reaches the lower or fourth threshold value thereof, the oscillation of the load current by the first temperature sensor is switched on again.

It follows that two current oscillations are present: a fast oscillation on account of the first temperature sensor, which oscillation stabilizes the temperature in the switch component, and a slow oscillation on account of the second temperature sensor, which oscillation periodically stops the fast oscillation. As a result, the soldered point temperature or housing temperature is thus set approximately in the middle of the hysteresis of the second temperature sensor. A load, for example a lamp or a motor, can be reliably switched on again after a short circuit since the temperature of the switch component can be significantly higher than the soldered point temperature or housing temperature during the short circuit.

In accordance with another feature of the invention, the first temperature sensor and/or the second temperature sensor is implemented as a diode and/or a bipolar transistor. In other words, the temperature sensors may be structurally identical, for example as a diode or a bipolar transistor, or else they may be structurally different.

In accordance with a concomitant feature of the invention, the switch component has a switch MOSFET.

Other features which are considered as characteristic for the invention are set forth in the appended claims.

Although the invention is illustrated and described herein as embodied in a temperature-protected electrical switch component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a basic diagram of a prior art PROFET;

FIG. 6 is a sectional view through the prior art PROFET shown in FIG. 5;

FIG. 7 shows a schematic block diagram of the PROFET of FIG. 5; and

FIG. 8 is a graph showing the oscillation of the load current of the PROFET of FIG. 5.

DESCRIPTION OF THE PREFERRED EMBODIMENTS

FIGS. 1–4 pertain to the invention and FIGS. 5–8, which have already been explained in the introduction above, illustrate the prior art. In FIGS. 1–4 corresponding parts are provided with the same reference symbols as in FIGS. 5–8.

Figure 1:
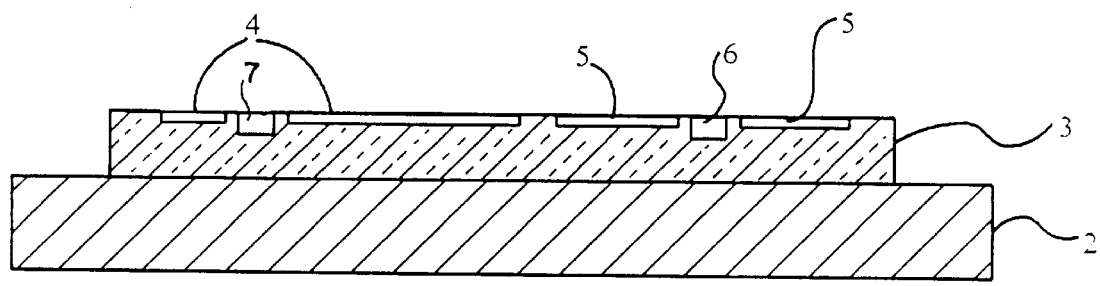
FIG. 1 is a sectional view of a semiconductor switch according to the invention.

Referring now to the figures of the drawing in detail, and first to FIG. 1, a second temperature sensor 7 is provided in addition to the first temperature sensor 6 in the IC part 4. The two temperature sensors 6, 7 may be constructed identically or else differently and comprise, for example, a diode or a bipolar transistor. While the first temperature sensor 6 is situated at a location which is heated rapidly, namely in the vicinity of the field-effect transistor 5, the second temperature sensor 7 is situated far away from the field-effect transistor 5 and thus becomes "hot" significantly more slowly than the first temperature sensor 6.

Figure 2:
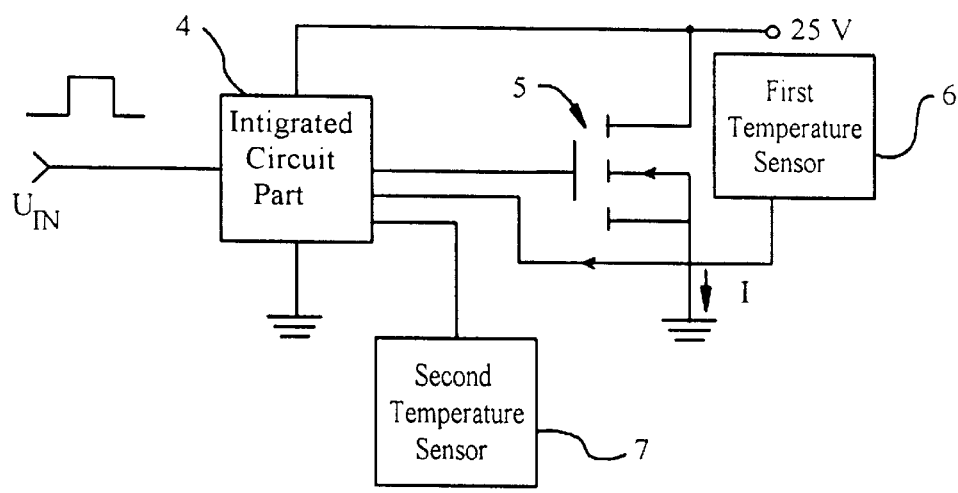
FIG. 2 is schematic block diagram for the semiconductor switch of FIG. 1.

As is shown in the block diagram of FIG. 2, the second temperature sensor 7 is connected to the logic arrangement or the IC part 4 in a similar manner to the first temperature sensor 6.

Figure 3:
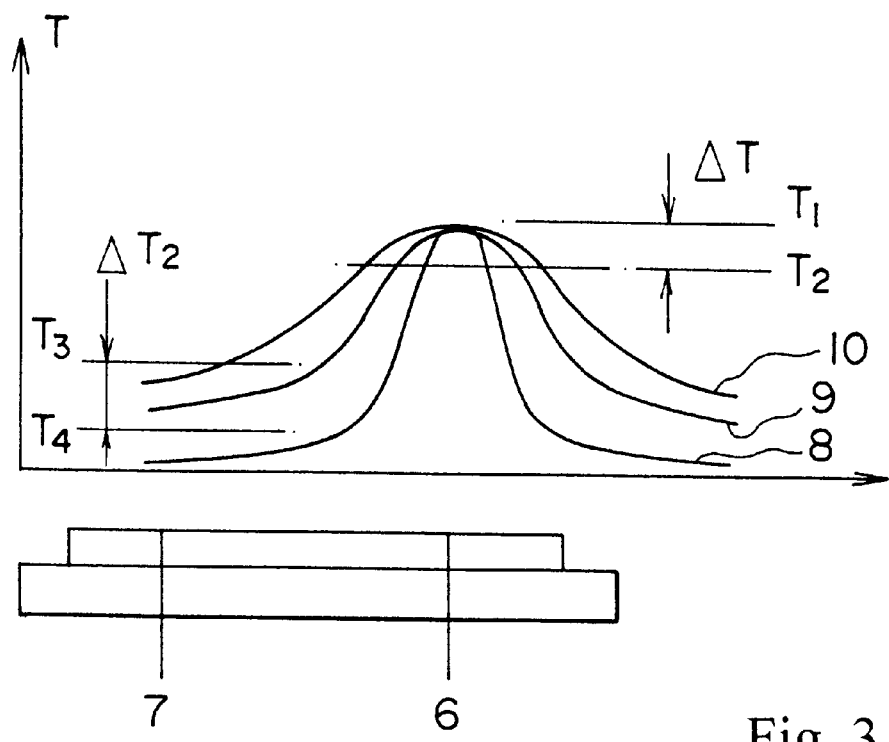
FIG. 3 is a graph and an associated diagram of threshold values of the two temperature sensors.
Figure 4:
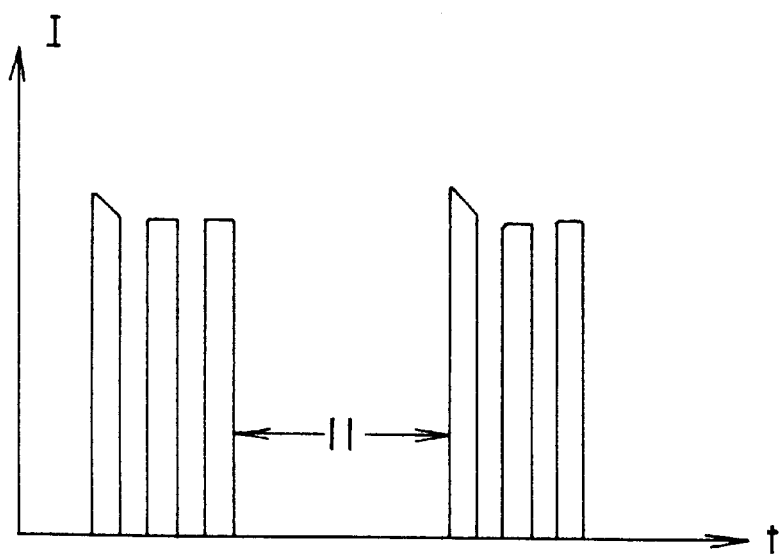
FIG. 4 is a graph showing the oscillation of the load current caused by the switch component according to the invention.

FIG. 3 shows the setting of the threshold values of the two temperature sensors 6 and 7. The upper threshold value $T_1$ and the lower threshold value $T_2$ of the first temperature sensor 6 lie above the upper threshold value $T_3$ and the lower threshold value of the second temperature sensor 7. The hysteresis $\Delta T_1$ of the first temperature sensor 6 is in this case somewhat lower than the hysteresis $\Delta T_2$ of the second temperature sensor 7.

Curves 8, 9 and 10 in FIG. 3 show how the temperature gradually propagates in the switch component. A temperature distribution corresponding to curve 8 is present in the first instance. There, the load current I oscillates corresponding to the switching on and off by the first temperature sensor 6. As the temperature rises in the switch component (compare curve 9), the temperature reaches the upper threshold value $T_3$ of the second temperature sensor 7 at the location of the second temperature sensor. At the instant, the logic circuit or the IC part 4 then switches off the oscillation by the first temperature sensor 6, thereby producing an oscillation-free region 11 (compare FIG. 4).

The temperature is then distributed uniformly in the switch component, whereby the latter cools down. If the lower threshold value $T_4$ is reached at the location of the second temperature sensor 7, then the oscillation by the first temperature sensor 6 is switched back on.

Owing to the "fast" oscillation by means of the first temperature sensor 6 and the "slow" oscillation by means of the second temperature sensor 7, the temperature of the soldered points or the housing temperature is set approximately to the middle of the hysteresis of the second temperature sensor 7.

As a result, a load, such as e.g. a lamp or a motor, can be reliably switched on after a short circuit since the temperature of the field-effect transistor 5 or switch can be significantly higher than the housing temperature during the short circuit.

What is claimed is:

1. A temperature-protected electrical switch component, comprising:

a switch component conducting a load current;

a first temperature sensor disposed at a first location, said first temperature sensor effecting an oscillation of the load current by causing said switch component to switch the load current off when a temperature detected by said first temperature sensor exceeds a first threshold value and to switch the load current on when the temperature detected by said first temperature sensor falls below a second threshold value, the second threshold value lying below the first threshold value;

a second temperature sensor disposed at a second location spaced apart from said first location, said second location assuming a lower temperature than said first location during an operation of said switch component, said second temperature sensor having a third threshold value below the second threshold value and a fourth threshold value below the third threshold value, said second temperature sensor causing said switch component to switch off the oscillation of the load current when the temperature detected by said second temperature sensor exceeds the third threshold value and to switch the oscillation back on when the temperature detected by said second temperature sensor falls below the fourth threshold value.

2. The temperature-protected electrical switch component according to claim 1, wherein said switch component is a semiconductor switch.

3. The temperature-protected electrical switch component according to claim 1, wherein said first location is defined at a location of the component which is warmest during operation.

4. The temperature-protected electrical switch component according to claim 1, wherein said second location is heated more slowly than said first location during operation.

5. The temperature-protected electrical switch component according to claim 1, wherein a temperature interval between the first and second threshold values is smaller than a temperature interval between the third and fourth threshold values.

6. The temperature-protected electrical switch component according to claim 1, wherein said second location is defined on said component.

7. The temperature-protected electrical switch component according to claim 1, wherein said second location is provided on a different component.

8. The temperature-protected electrical switch component according to claim 1, wherein one of said first and second temperature sensors is a diode.

9. The temperature-protected electrical switch component according to claim 1, wherein said first and second temperature sensors are diodes.

10. The temperature-protected electrical switch component according to claim 1, wherein said switch component comprises a switch MOSFET.

11. The temperature-protected electrical switch component according to claim 1, wherein one of said first and second temperature sensors is a bipolar transistor.

12. The temperature-protected electrical switch component according to claim 1, wherein said first and second temperature sensors are bipolar transistors.

* * * * *